(12) United States Patent
Masuoka et al.

(10) Patent No.: US 7,030,464 B2
(45) Date of Patent: Apr. 18, 2006

(54) SEMICONDUCTOR DEVICE AND METHOD OF MANUFACTURING THE SAME

(75) Inventors: Yuri Masuoka, Kanagawa (JP); Naohiko Kimizuka, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/791,381

(22) Filed: Mar. 3, 2004

(65) Prior Publication Data

US 2004/0173855 A1 Sep. 9, 2004

(30) Foreign Application Priority Data

Mar. 5, 2003 (JP) ............................. 2003-058099
Jul. 10, 2003 (JP) ............................. 2003-272796

(51) Int. Cl.
*H01L 29/167* (2006.01)

(52) U.S. Cl. .................. 257/610; 257/344; 257/376; 257/607; 257/611; 257/612; 257/655; 257/917; 438/301; 438/305; 438/306; 438/307; 438/529

(58) Field of Classification Search ..............................
257/E29.005–E29.007, E29.012, E29.266, 257/394, 607, 610–612, 655, 917, 344, 376, 257/E29.277, E29.278, E29.28; 438/301, 438/305–307, 529

See application file for complete search history.

(56) References Cited

U.S. PATENT DOCUMENTS

| 5,821,147 | A | * | 10/1998 | Kizilyalli | ..................... 438/305 |
| 6,063,682 | A | * | 5/2000 | Sultan et al. | ............... 438/305 |
| 6,165,858 | A | * | 12/2000 | Gardner et al. | ............ 438/305 |
| 6,706,582 | B1 | * | 3/2004 | Yanagida et al. | ........... 438/231 |
| 2004/0121565 | A1 | * | 6/2004 | Wieczorek et al. | ......... 438/481 |

FOREIGN PATENT DOCUMENTS

JP 07-131006 A 5/1995
JP 10-50988 A 2/1998

* cited by examiner

*Primary Examiner*—Allan R. Wilson
(74) *Attorney, Agent, or Firm*—Sughrue Mion, PLLC

(57) ABSTRACT

A technology of restraining junction leakage in a semiconductor device is to be provided. There is provided a semiconductor device provided with a semiconductor substrate, a gate electrode 9 formed on the semiconductor substrate, and a source/drain region formed beside the gate electrode, wherein the source/drain region 4 comprises a first impurity diffusion region including a first P-type impurity and located in the proximity of a surface of the semiconductor substrate, and a second P-type impurity diffusion region located below the first impurity diffusion region and including a second P-type impurity having a smaller diffusion coefficient in the semiconductor substrate than the first P-type impurity.

13 Claims, 11 Drawing Sheets

CONVENTIONAL SEMICONDUCTOR DEVICE

⬇ AFTER IMPURITY ACTIVATING ANNEALING

SEMICONDUCTOR DEVICE AND METHOD OF MANUFACTURING THE SAME

This application is based on Japanese patent application Nos. 2003-058099 and 2003-272796, the contents of which are incorporated hereinto by reference.

FIELD OF THE INVENTION

The present invention relates to a semiconductor device and a method of manufacturing the same.

BACKGROUND OF THE INVENTION

Along with the progressing micronization of semiconductor devices, there has arisen a problem that a leakage current increases while a transistor is off, because of a so called short channel effect caused by expansion of a depletion layer around a drain diffusion layer toward a channel. For restraining the short channel effect, up until now an LDD (Lightly Doped Drain) structure has popularly been utilized, whereby an offset gate layer having a lower impurity concentration is formed between a gate and a source or a drain so as to achieve an impurity concentration gradient, and in order to cope with a further micronization of semiconductor devices, a technique of forming a shallow source or drain region (hereinafter briefly referred to as a "source/drain region") in the proximity of a surface of a semiconductor substrate is popularly adopted. FIGS. 10A through 10D are cross-sectional process drawings showing a method of manufacturing a conventional semiconductor device.

Initially, a method of manufacturing an ordinary MOS transistor provided with a LDD structure will be described referring to FIGS. 10A through 10D. Firstly an element isolation dielectric film 2 is formed on a semiconductor substrate 1 by LOCOS method or trench method as shown in FIG. 10A, for defining a field region where a MOS transistor is to be formed. Then a gate dielectric film 8 constituted of a silicon oxide layer is formed by thermal oxidation method or the like, after which a polysilicon is deposited by low-pressure (LP) CVD method etc., to thereby form a gate electrode 9 by a known photolithography or a dry etching technique.

Thereafter, as shown in FIG. 10B, an LDD region 7 is formed by ion implantation method utilizing the gate electrode 9 as a mask; specifically by implanting an N-type impurity such as a low-concentration phosphorus (P) or arsenic (As) in case of an N-MOS transistor, or by implanting a P-type impurity such as a low-concentration boron B or $BF_2$ in case of a P-MOS transistor. Then a silicon oxide layer is deposited all over the substrate by LPCVD, and the silicon oxide layer is etched back by anisotropic dry etching, to thereby form a sidewall 10 on a lateral face of the gate electrode 9 as shown in FIG. FIG. 10C.

After the above, as shown in FIG. 10D, a source/drain region 4 is formed by implanting an N-type impurity such as a high-concentration P or As in case of an N-MOS transistor, or by implanting a P-type impurity such as a high-concentration B or $BF_2$ in case of a P-MOS transistor, utilizing the gate electrode 9 and the sidewall 10 as a mask. At this stage, the LDD region 7 that serves as an offset gate layer and the high-concentration source/drain region 4 are formed in a self-aligned manner, right under the sidewall 10 and outside thereof respectively.

Referring to such MOS transistor, when forming a shallow source/drain region in the proximity of a substrate surface, a sheet resistance of an impurity diffusion layer tends to increase. Accordingly, as a popular method of reducing such resistance a silicide layer which is a compound of silicon and a metal is formed in a part of the impurity diffusion layer. However, since the silicide layer is formed through a reaction of silicon and a metal, it is difficult to accurately control a thickness of the silicide layer. Consequently, once the silicide layer has grown in an excessive thickness, leakage is prone to take place between the substrate. Also, in case of such MOS transistor, forming a shallow source/drain region in the proximity of the substrate surface often incurs leakage at a junction, because impurity concentration in the source/drain region shows a steep gradient in a depth wise direction.

The JP-A No. 1995-131006 discloses a structure and method whereby junction leakage between a source/drain region bottom portion and a semiconductor substrate is reduced, while restraining a short channel effect in an N-MOS transistor provided with a shallow source/drain region in the proximity of the substrate surface.

FIGS. 11A to 11C are cross-sectional process drawings showing a method of manufacturing a conventional N-MOS transistor.

This document describes a method of implanting an N-type impurity such as As utilizing the gate electrode 9 as a mask to form an N-type impurity layer 12 on a P-type semiconductor substrate 1 as shown in FIG. 11A; likewise implanting an N-type impurity such as P utilizing the gate electrode 9 as a mask to form a low-concentration N-type impurity layer 13 only on a bottom portion of the N-type impurity layer 12 as shown in FIG. 11B; then executing a brief heat treatment so as to form the N-type source/drain region 4 having a mild ion concentration gradient as shown in FIG. 1C.

SUMMARY OF THE INVENTION

The JP-A No. 1995-131006 states to the effect that a similar effect can be achieved also in case of forming a P-MOS transistor on an N-type semiconductor substrate. Nevertheless it is difficult to practically apply the method of manufacturing an N-MOS transistor described in this document as it is to manufacturing of a P-MOS transistor.

Such conventional art has not taken into consideration a diffusion coefficient of an impurity that constitutes a bottom portion of the diffusion layer. This leads to a drawback that a material having a large diffusion coefficient may often be employed as an impurity for constituting a bottom portion of a diffusion layer in a heat treatment process for activating the impurity, resulting in formation of a diffusion layer that is deeper than it should be, and consequently in reduced short channel restraining effect.

The present invention has been conceived in view of the foregoing problems, with an object to provide a technique of restraining junction leakage in a semiconductor device.

According to the present invention, there is provided a semiconductor device provided with a semiconductor substrate; a gate electrode provided on the semiconductor substrate; an impurity diffusion region provided beside the gate electrode; wherein the impurity diffusion region comprises a first impurity diffusion region including a first P-type impurity and located in the proximity of a surface of the semiconductor substrate, and a second P-type impurity diffusion region located below the first impurity diffusion region and including a second P-type impurity having a smaller diffusion coefficient in the semiconductor substrate than the first P-type impurity. According to the present invention, since the impurity diffusion region is provided with the second P-type impurity diffusion region including the second P-type impurity having a smaller diffusion coefficient in the semiconductor substrate than the first P-type impurity, the ion concentration gradient at a bottom portion of the impurity diffusion region can be mildened, and resultantly junction leakage in the semiconductor device can be restrained.

A constitution of the present invention has been described as above, however it is to be understood that an arbitrary combination of the foregoing factors is also effective as an aspect of the present invention. Further, an expression in the category of a method of manufacturing a semiconductor device converted from the expression in the present invention is also effective as an aspect of the present invention.

According to the present invention, junction leakage in a semiconductor device can be restrained.

DETAILED DESCRIPTION OF THE INVENTION

Figure 1A:
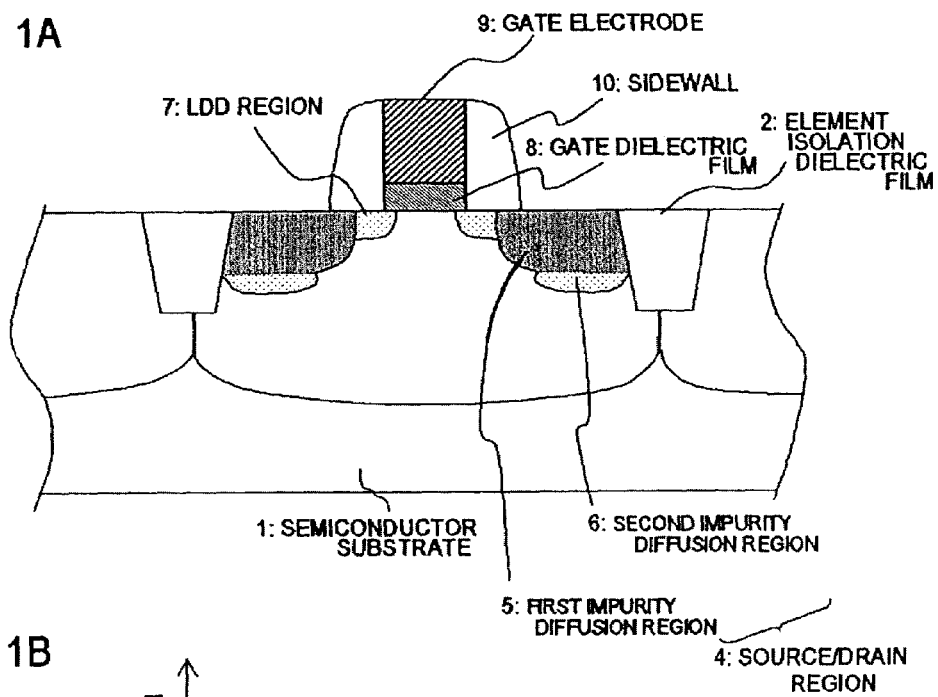
FIG. 1A is a schematic cross-sectional drawing showing a structure of a semiconductor device provided with a P-MOS transistor according to an example of the present invention.

Referring to the accompanying drawings, embodiments of the present invention will be described hereunder. Meanwhile, same components included in different drawings will be given the same reference numeral, and description thereof will be omitted as the case may be.

FIG. 1A is a cross-sectional view showing a structure of a semiconductor device including a P-MOS transistor according to an example of the present invention.

Referring to FIG. 1A, the semiconductor device according to the embodiment includes a semiconductor substrate 1, a gate electrode 9 provided on the semiconductor substrate 1, and an impurity diffusion region (source/drain region 4) provided beside the gate electrode 9, and the impurity diffusion region (source/drain region 4) is provided with a first impurity diffusion region 5 located in the proximity of a surface of the semiconductor substrate 1 including a first P-type impurity, and a second P-type impurity diffusion region 6 located below the first impurity diffusion region 5 including a second P-type impurity having a smaller diffusion coefficient in the semiconductor substrate 1 than the first P-type impurity. Accordingly, since the semiconductor device of this embodiment is provided with the second P-type impurity diffusion region 6, located below the first impurity diffusion region 5, including the second P-type impurity having a smaller diffusion coefficient in the semiconductor substrate 1 made of a silicon-based semiconductor or the like than the first P-type impurity, junction leakage originating from a silicide layer or from a defect, degradation of an isolation characteristic, degradation of reliability of a gate dielectric film or variation of a transistor characteristic can be prevented while restraining a short channel effect at a time, even in a semiconductor device provided with a shallow junction.

Also, the first P-type impurity diffusion region 5 and the second impurity diffusion region 6 may be included in the impurity diffusion regions (source/drain region 4) located by both sides of the gate electrode 9, or just in either of the impurity diffusion regions (source/drain regions 4). For example, even in case where the first and second impurity diffusion regions 5, 6 are only included in the drain side impurity diffusion region, a sufficient leakage restraining effect can be achieved in a P-MOS designed for a specific purpose. In such case, though, naturally it is preferable to form the first and second impurity diffusion regions 5, 6 on both sides of the gate electrode 9, from the viewpoint of enhancing the leakage restraining effect.

Further, the first P-type impurity may contain B, and the second P-type impurity may contain In.

According to such constitution, since the second impurity diffusion region 6 formed by implantation of In is provided at a bottom portion of the first impurity diffusion region 5 formed by implantation of B or $BF_2$ at a shallow level in the proximity of the substrate surface, it becomes possible to accurately control an impurity concentration distribution in the source/drain region 4 and to restrain a short channel effect, to thereby restrain leakage originating from a silicide layer. Also, the In contained in the second impurity diffusion region 6 has a smaller diffusion coefficient in the semiconductor substrate 1 made of a silicon-based semiconductor or the like than B or $BF_2$ and hence does not expand to an unintended region because of an impurity activating annealing process, therefore an isolation characteristic of the transistor can be improved, and also leakage originating from a defect can be restrained. Further, when forming the second impurity diffusion region 6, since In is employed instead of B or $BF_2$ and besides an energy or amount of the implantation is adjusted to a predetermined value, leakage originating from a defect caused by In implantation can be restrained, and also penetration of the In through the gate dielectric film 8 can be prevented, resulting in upgraded reliability of the gate dielectric film 8 and reduced variation of a transistor characteristic.

A reason of the foregoing advantage is that constituting the source/drain region 4 of the P-MOS transistor with the first impurity diffusion region 5 formed by implantation of B or $BF_2$ and the second impurity diffusion region 6 formed by implantation of In permits control of a shape of the source/drain region 4, thereby enabling to restrain a short channel effect caused by diffusion of B as well as junction leakage originating from a silicide layer.

Another reason is that forming the second impurity diffusion region 6 utilizing In impedes excessive expansion of the In by diffusion even upon executing a heat treatment for activating the impurity thereby maintaining a desirable isolation characteristic, and that since the heat treatment permits recovery of a defect caused by the impurity implantation, junction leakage originating from a defect can be reduced.

Still another reason is that degradation of reliability of the gate dielectric film 8 or a variation of a transistor characteristic, caused by diffusion of B into the gate dielectric film 8, can be prevented unlike a case of forming the second impurity diffusion region 6 utilizing B or $BF_2$.

Furthermore, in the semiconductor device according to this embodiment, emergence of a defect because of In implantation can be restrained, and degradation of reliability of the gate dielectric film 8 caused by penetration of In through the gate dielectric film 8, as well as a variation of a transistor characteristic can be restrained.

A reason of the foregoing advantage is that the implanting conditions of In are determined not only based on a forming position or impurity concentration of the second impurity diffusion region 6, but also according to a measurement result of dependence of junction leakage on an implanting energy or an implanting amount or to a correlation between an implanting energy and a thickness of the gate electrode, which permits preventing emergence of a defect due to In implantation or influence to the gate dielectric film 8.

As already described referring to the related art, the source/drain region 4 is formed at a shallow level in the proximity of the substrate surface in order to restrain a short channel effect deriving from the micronization of semiconductor devices, however a shallow junction incurs a steep impurity concentration gradient in the proximity of the junction which results in an increase of junction leakage, and besides tends to incur leakage originating from a silicide layer formed for reducing a sheet resistance of a diffusion layer. To solve such problem the JP-A No. 1995-131006 discloses a technique of forming a low-concentration impurity diffusion layer at a bottom portion of the source/drain region, however it is difficult, for the reasons given below, to apply the method described in this document to a P-MOS transistor, since B or $BF_2$ which has a higher solubility limit as a P-type impurity in case of a P-MOS transistor and the B has a greater diffusion coefficient in the semiconductor substrate.

Basically, it is important for an impurity to be implanted in a semiconductor substrate to be capable of being implanted in a high concentration (in other words, to have a high solubility limit). It is from such viewpoint that P or As is popularly used as an N-type impurity, and B or $BF_2$ as a P-type impurity, when performing an ion implantation on a semiconductor substrate.

Now, B used as a P-type impurity diffuses quickly (i.e. has a great diffusion coefficient in a semiconductor substrate). Accordingly, in case where B or $BF_2$ is implanted into a deep region the P-type impurity diffuses as far as an element isolation region, thereby causing leakage and resulting in degradation of an isolation characteristic.

By contrast, in case where B or $BF_2$ is implanted only in a shallow region in the proximity of the substrate surface for restraining leakage due to the diffusion of B or $BF_2$, B or $BF_2$ diffuses toward a channel upon executing a heat treatment for activating the impurity, thereby impeding effective prevention of a short channel effect.

Also, a silicide layer cannot be sufficiently covered with an impurity diffusion region, therefore leakage is prone to take place originating from the silicide layer.

However, if a temperature of the heat treatment is set lower or if duration of the heat treatment is shortened in order to restrain the diffusion of B or $BF_2$, a defect that has emerged during the impurity implantation cannot be sufficiently restored, and junction leakage is prone to take place because of the defect.

Further, in case of employing $BF_2$ as a P-type impurity, the $BF_2$ introduced into the gate electrode may penetrate through the gate dielectric film and diffuse into the channel region owing to existence of fluorine, by which a transistor characteristic is prone to vary, thus leading to degradation of reliability of the gate dielectric film. Since the gate electrode and gate dielectric film are particularly becoming thinner along with the micronization of semiconductor devices, the above phenomenon tends to take place more prominently, in case of additionally implanting $BF_2$ into a deep position of a bottom portion of the source/drain region.

Since the foregoing problem derives from utilizing B or $BF_2$ as a P-type impurity, a possible solution is to select an impurity that has a smaller diffusion coefficient in a semiconductor substrate made of a silicon-based semiconductor than B or $BF_2$. Besides B or $BF_2$, for instance In is known as a P-type impurity that has a smaller diffusion coefficient in a semiconductor substrate than B or $BF_2$, because of which a method of forming an impurity diffusion layer utilizing In has been proposed, however In has a lower solubility limit than B or $BF_2$, and is not perfectly suitable for a high-concentration implantation.

Besides, a heavy ion such as In is prone to incur channeling, and is therefore difficult to implant at a shallow position. Further, because of being a heavy ion In is prone to cause a defect, therefore leakage originating from a defect increases unless implantation conditions are appropriately set, and once In implanted into the gate dielectric film gate reaches the gate dielectric film, reliability of the gate dielectric film is degraded and a variation of a transistor characteristic is incurred.

Accordingly, this embodiment offers the solution by the combination of the advantage of B or $BF_2$ of having a high solubility limit and being easily implantable in a high concentration and that of In of having a smaller diffusion coefficient in a semiconductor substrate than B or $BF_2$ and being easily implantable into a deep position by channeling. Specifically, the first impurity diffusion region 5 to be located in the proximity of the substrate surface is formed with B or $BF_2$, while the second impurity diffusion region 6 to be located at a bottom portion of the first impurity diffusion region 5 (the skirts of the impurity concentration distribution in a depth wise direction) is formed with In, and as a result of these two types of implantation the source/drain region 4 can be accomplished with the advantage that its shallower portion is constituted of a high concentration while its deeper portion has a mild concentration gradient so that a variation of concentration distribution can be restrained even through an impurity activating annealing.

Figure 1B:
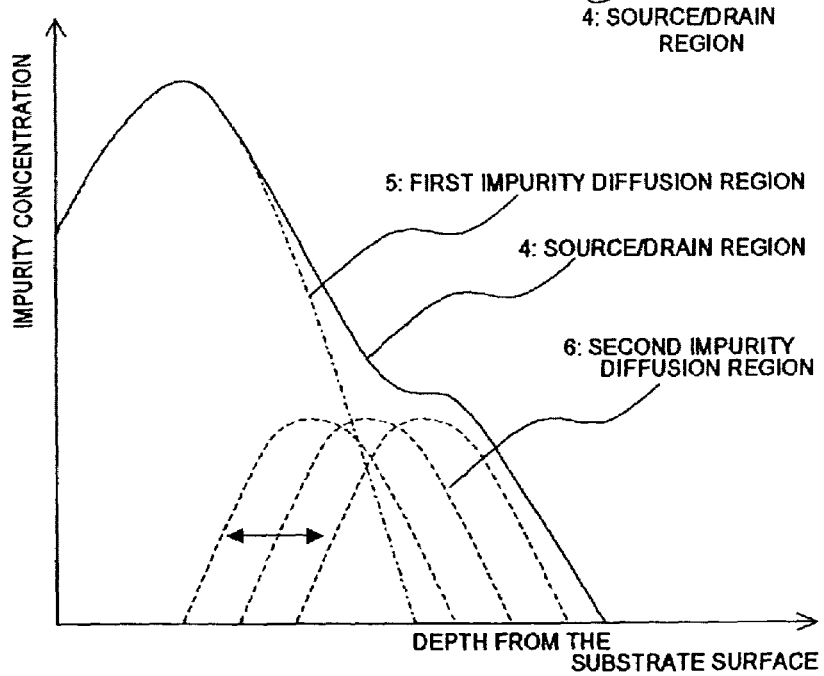
FIG. 1B is a schematic cross-sectional drawing showing a structure of a semiconductor device provided with a P-MOS transistor according to an example of the present invention.

Also, in this embodiment, the first impurity diffusion region 5 and the second impurity diffusion region 6 may be either in contact with each other or partly overlapping, as shown in FIGS. 1A and 1B.

As a result of adopting such constitution, a short channel effect can be restrained; an isolation characteristic can be upgraded; leakage originating from a silicide layer or a defect can be reduced; and further by appropriately setting the implanting conditions of In, leakage originating from a defect caused by the In implantation, degradation of reliability of a gate dielectric film because of penetration of In, and a variation of a transistor characteristic can be effectively prevented.

Meanwhile, though In is known in the art as a P-type impurity and some patent publications (for example the JP-A No. 1998-50988) disclose a method of forming a P-type impurity diffusion layer utilizing B or In, In has a drawback of being prone to cause a defect in a crystal.

On the other hand, by setting implanting conditions of In as specified in the subsequent passages, it becomes possible to stably achieve the foregoing advantage. These In implanting conditions have been established through the experiments and calculations by the present inventors, and the concept of setting the implanting conditions in consideration of leakage originating from a defect caused by In implantation and a thickness of a gate electrode and so forth has been created based on the knowledge of the present inventors.

EXAMPLES

The present invention will be described in further details here below referring to examples, however it is to be understood that the present invention is not limited thereto.

An example of the present invention will be described as under referring to FIG. 1A through FIG. 9.

FIGS. 1A and 1B are schematic cross-sectional drawings showing a structure of a semiconductor device provided with a P-MOS transistor according to an example of the present invention.

Firstly, a structure of a semiconductor device according to this example will be described referring to FIG. 1A. The semiconductor device of this example is provided with a P-MOS transistor including a source/drain region 4 consisting of a first impurity diffusion region 5 formed with B or $BF_2$ utilizing a gate electrode 9 and a sidewall 10 as a mask in a P-MOS forming region isolated by an element isolation dielectric film 2, and a second impurity diffusion region 6 formed with In at a bottom portion of the first impurity diffusion region.

The second impurity diffusion region 6 has a lower impurity concentration than the first impurity diffusion region 5, and is located at a bottom portion of the first impurity diffusion region 5 where an impurity concentration gradient is steep, thereby constituting the source/drain region 4 (solid line) presenting a mild impurity concentration gradient in a depth wise direction as a whole including the first impurity diffusion region 5 and the second impurity diffusion region 6, as shown in FIG. 1B.

Meanwhile, a forming position, a peak concentration and concentration distribution of the first impurity diffusion region 5 and the second impurity diffusion region 6 are to be determined in consideration of a shape of the transistor (for instance a width of the gate electrode 9, a thickness of the gate dielectric film 8, a width or depth of the element isolation dielectric film 2, etc.) and performance of the transistor (for example an off leakage current or driving voltage, etc.); therefore, for example, now that the first impurity diffusion region 5 is to be formed at a shallow position as a result of the ongoing micronization of semiconductor devices, the second impurity diffusion region 6 also has to be formed at a shallow level.

Accordingly, the second impurity diffusion region 6 has only to be overlapping with a bottom portion of the first impurity diffusion region 5 so as to milden the concentration gradient, and can be optionally formed, for example, anywhere within a range marked by the arrow in FIG. 1B. Also, though the second impurity diffusion region 6 is located on both of the source/drain sides in FIG. 1A, the second impurity diffusion region 6 may be provided only on either of the source or the drain side.

Further, FIG. 1A only shows a structure of the semiconductor device according to this example, therefore the semiconductor device may further be provided with a silicide layer formed through a reaction of silicon and a metal such as titan, nickel, cobalt, etc. in the proximity of a surface of the source/drain region, or with a tungsten film additionally formed on the silicide layer.

Furthermore, though an LDD region 7 is provided inside the source/drain region 4 in FIG. 1A, it is also preferable to form an extension diffusion layer inside the source/drain region 4 but having a shallower junction than the source/drain region 4, or a pocket diffusion layer below the extension diffusion layer.

FIGS. 2A through 4C are cross-sectional process drawings showing a method of manufacturing the foregoing semiconductor device. Referring to the cross-sectional process drawings of FIGS. 2A through 4C, a method of manufacturing a semiconductor device having the structure of FIG. 1A will now be described. FIGS. 2A through 4C show a process constituted of series of steps, which are divided according to stages for the sake of explicitness.

Meanwhile, though the MOS transistor includes various types such as a transistor having a thin gate dielectric film that can be driven by a low voltage, a transistor designed to restrain an off current for reducing power consumption, or a high-voltage I/O transistor having a thick dielectric film etc., the subsequent description simply refers to formation of a P-MOS transistor and a N-MOS transistor, regardless of such distinctions.

Figure 2A:
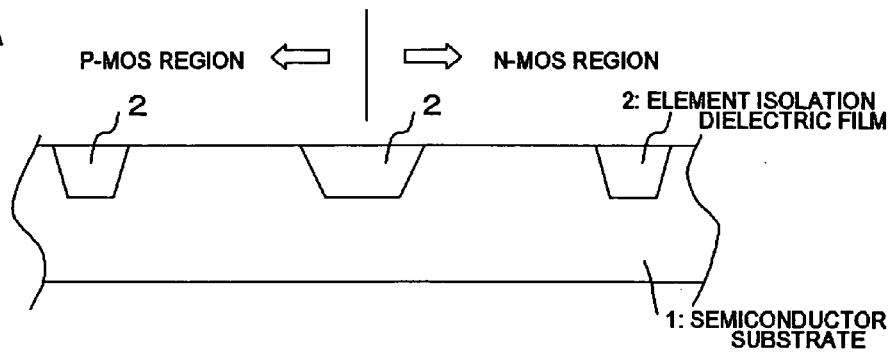
FIG. 2A is a cross-sectional process drawing showing a method of manufacturing a semiconductor device according to an example of the present invention.

Firstly as shown in FIG. 2A, an element isolation dielectric film 2 for defining a field region is formed on a semiconductor substrate 1 made of a P-type silicon substrate or the like, by STI (Shallow Trench Isolation), and a sacrificial layer (not shown) is formed all over the substrate by thermal oxidation method.

Figure 2B:
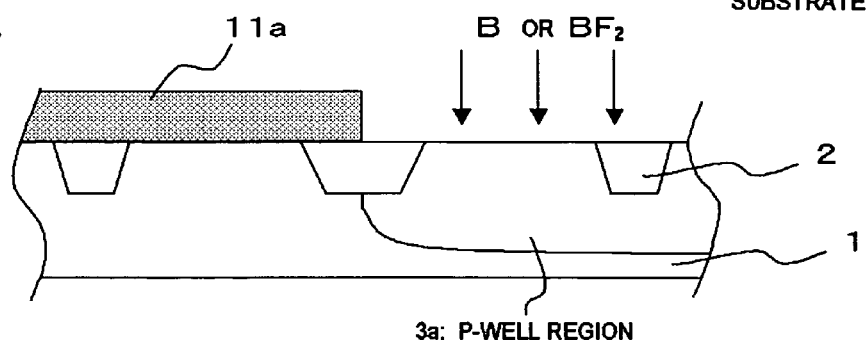
FIG. 2B is a cross-sectional process drawing showing a method of manufacturing a semiconductor device according to an example of the present invention.

Then a resist is applied all over the substrate, and a resist pattern 11A is formed on the P-MOS region by a known lithography method, after which a P-type impurity such as B, $BF_2$ is implanted on the N-MOS region to form a P-well region 3a as shown in FIG. 2B.

Figure 2C:
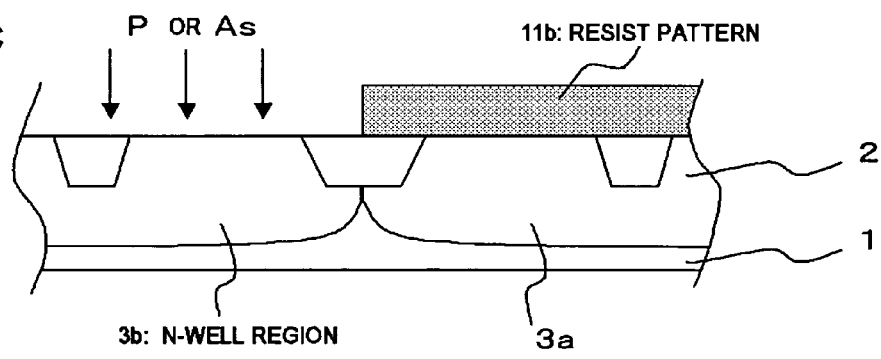
FIG. 2C is a cross-sectional process drawing showing a method of manufacturing a semiconductor device according to an example of the present invention.

Thereafter the resist pattern 11a is removed by ashing or stripping process etc., and as shown in FIG. 2C a resist pattern 11b is formed on the N-MOS region, after which an N-type impurity such as P or As is implanted on the P-MOS region to form an N-well region 3b. Then annealing is executed for diffusing and activating the impurity.

Figure 2D:
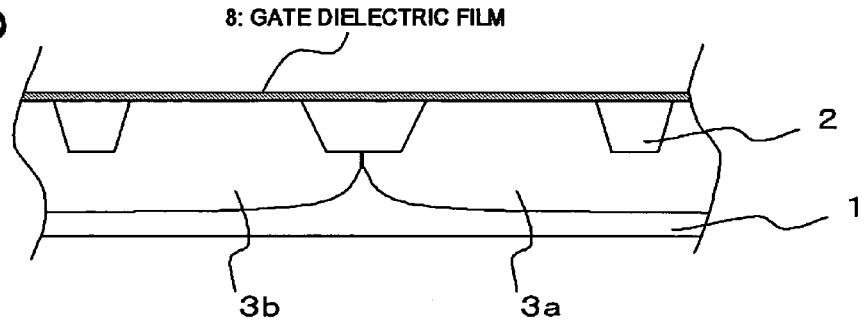
FIG. 2D is a cross-sectional process drawing showing a method of manufacturing a semiconductor device according to an example of the present invention.

Then after removing the resist pattern 11b by ashing or stripping process etc. and the sacrificial layer by wet etching, a silicon oxide layer is formed by CVD method or the like, and nitrogen is introduced into the silicon oxide layer by plasma nitriding, annealing, implantation, etc. to form the gate dielectric film 8 of a desired thickness as shown in FIG. 2D.

A thickness of the gate dielectric film 8 may be adjusted according to a type of the transistor, and a preferable thickness of the gate dielectric film 8 is approx. 13 to 20 Å (1.3 to 2.0 nm) for a low driving voltage transistor, approx. 15 to 30 Å (1.5 to 3.0 nm) for a transistor of a restrained off leakage current, and approx. 13 to 70 Å (1.3 to 7.0 nm) for an I/O transistor. At this stage, in case where a transistor having a thin gate dielectric film 8 and another transistor having a thick transistor are provided in mixture, it is preferable, for example, to remove a part of the thick gate dielectric film 8 so as to form a thin portion of the gate dielectric film.

Figure 3A:
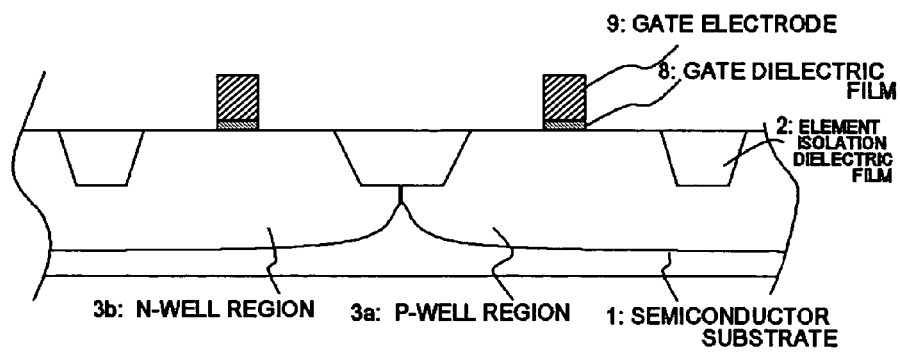
FIG. 3A is a cross-sectional process drawing showing a method of manufacturing a semiconductor device according to an example of the present invention.

Then as shown in FIG. 3A, after depositing or growing a polycrystalline silicon or a non-crystalline silicon for constituting a gate electrode, a resist pattern (not shown) is formed by a known lithography method, and dry etching is performed on the above silicon material and the gate dielectric film 8 to form the gate electrode 9. By the way, an ion implantation may also be executed on the gate electrode 9, for example implantation of a P-type impurity on the P-MOS region, after depositing or growing a polycrystalline silicon or non-crystalline silicon.

Figure 3B:
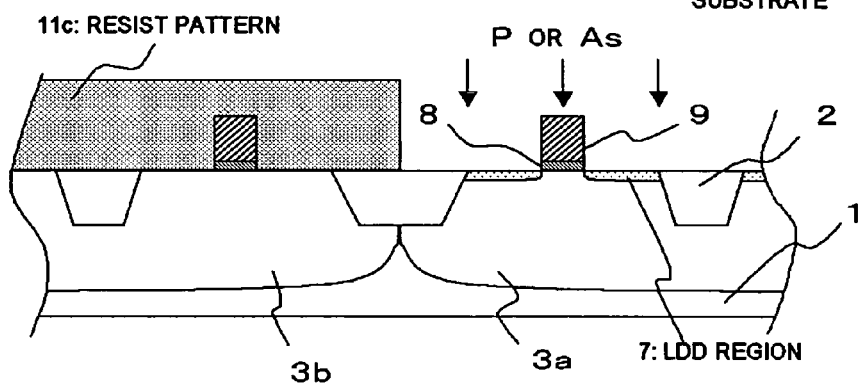
FIG. 3B is a cross-sectional process drawing showing a method of manufacturing a semiconductor device according to an example of the present invention.
Figure 9:
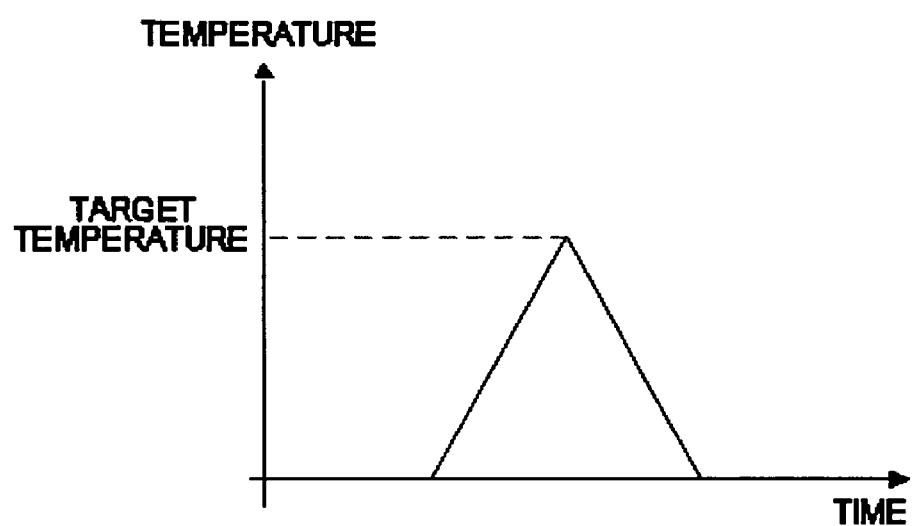
FIG. 9 is a graph for explaining a spike annealing process.
Figure 10A:
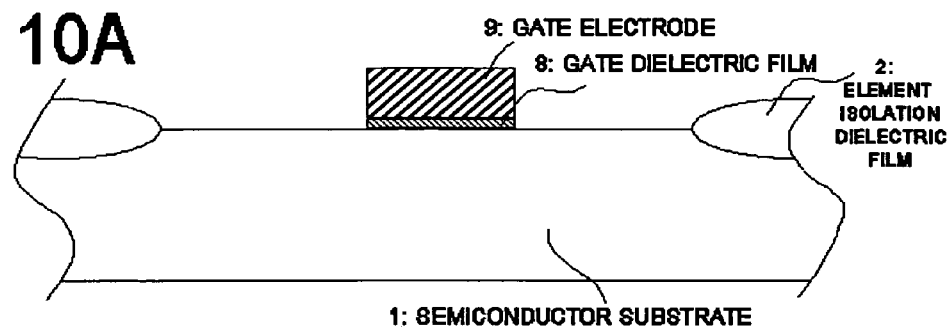
FIG. 10A is a cross-sectional process drawing showing a method of manufacturing a conventional semiconductor device.
Figure 10B:
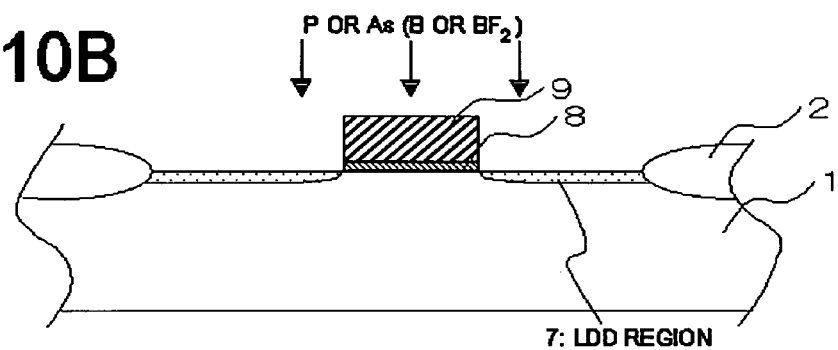
FIG. 10B is a cross-sectional process drawing showing a method of manufacturing a conventional semiconductor device.
Figure 10C:
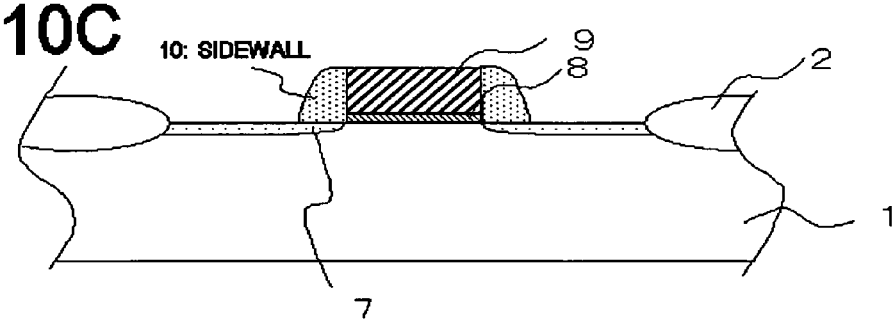
FIG. 10C is a cross-sectional process drawing showing a method of manufacturing a conventional semiconductor device.
Figure 10D:
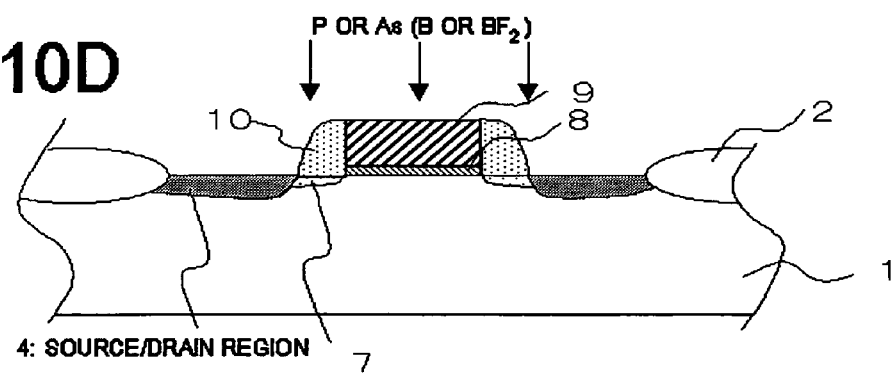
FIG. 10D is a cross-sectional process drawing showing a method of manufacturing a conventional semiconductor device.
Figure 11A:
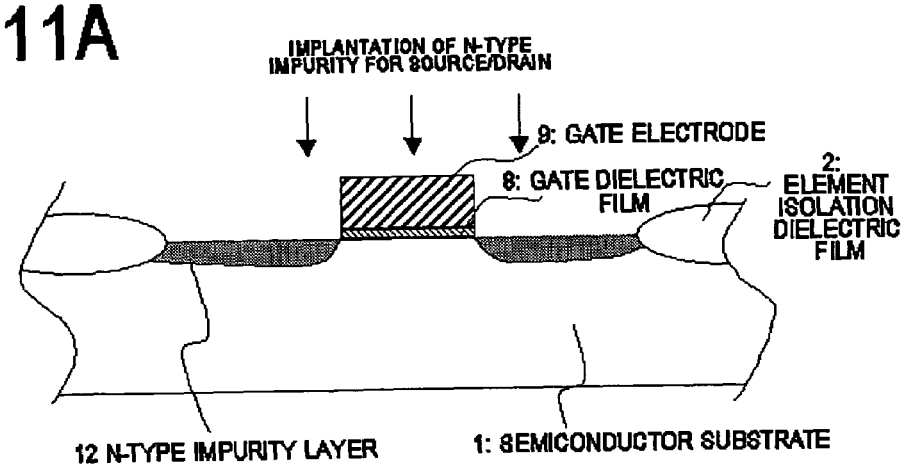
FIG. 11A is a cross-sectional process drawing showing a method of manufacturing a conventional semiconductor device.
Figure 11B:
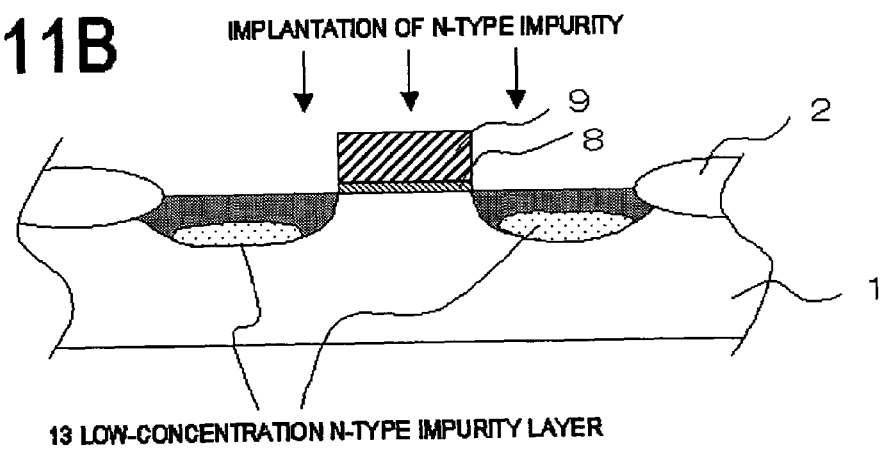
FIG. 11B is a cross-sectional process drawing showing a method of manufacturing a conventional semiconductor device.
Figure 11C:
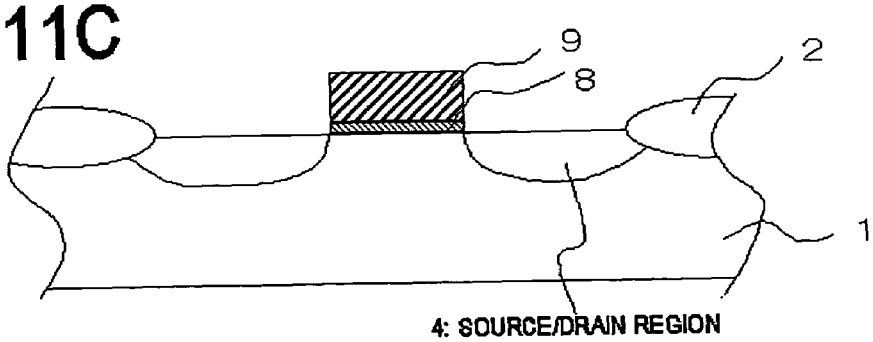
FIG. 11C is a cross-sectional process drawing showing a method of manufacturing a conventional semiconductor device.

Now referring to FIG. 3B, a resist pattern 11c is formed by a known photolithography method on the P-MOS region, and after implanting an N-type impurity such as P or As utilizing the gate electrode 9 in the N-MOS region as a mask the resist pattern 11c is removed, and then annealing is performed for 0 to approx. 10 seconds in a nitrogen atmosphere or a nitrogen and oxygen atmosphere under a temperature of 800 to 1000 degree centigrade for activating the impurity in the N-MOS region, to form an LDD region 7 in the N-MOS region. At this stage, a pocket diffusion layer or an extension diffusion layer may be formed, instead of or in addition to the LDD region 7. Here, the reason for specifying the duration of the annealing process including 0 second is that, while the duration of the annealing process usually means a retention time after reaching a target temperature, an annealing method of immediately lowering temperature upon reaching a target temperature (called "spike anneal" in the art) may be employed, as shown in FIG. 9.

Figure 3C:
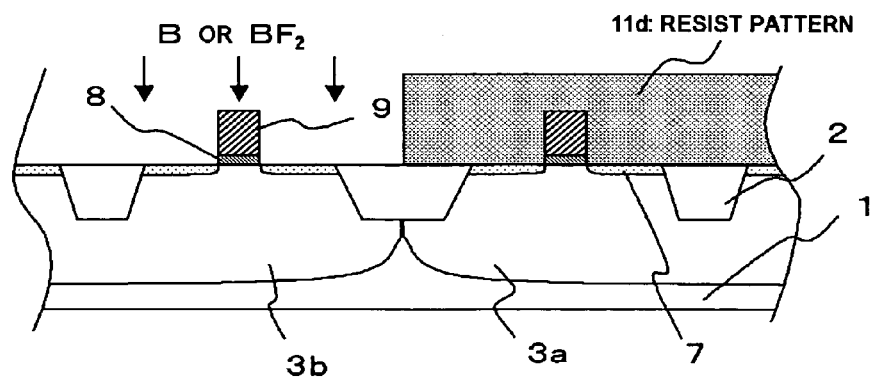
FIG. 3C is a cross-sectional process drawing showing a method of manufacturing a semiconductor device according to an example of the present invention.

Then as shown in FIG. 3C, a resist pattern 11d is formed on the N-MOS region by a known photolithography method, and a P-type impurity such as B or $BF_2$ is implanted utilizing the gate electrode 9 in the P-MOS region as a mask to form the LDD region 7. At this stage too, a pocket diffusion layer or an extension diffusion layer may be formed, instead of or in addition to the LDD region 7. Further, a fluorine implantation may be executed for upgrading reliability of the P-MOS transistor.

Figure 3D:
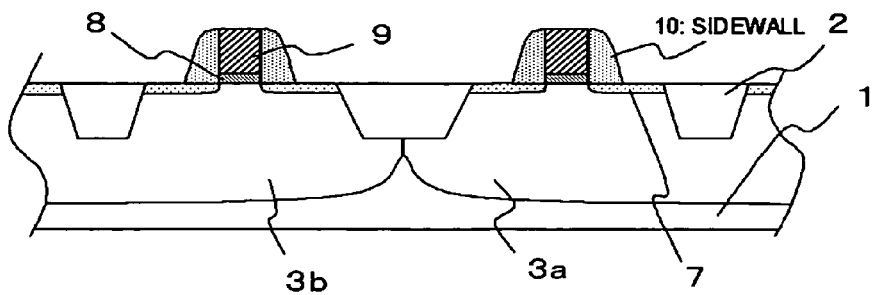
FIG. 3D is a cross-sectional process drawing showing a method of manufacturing a semiconductor device according to an example of the present invention.

Thereafter, after depositing a silicon oxide layer or a nitride layer all over the semiconductor substrate 1, etch-back is performed to form a sidewall 10 on a lateral face of the gate electrode 9, as shown in FIG. 3D. The process up to this step is similar to a popular manufacturing method of a MOS transistor, and the formation sequence of the well region or the LDD region in the P-MOS region and the N-MOS region, implanting conditions of the N-type impurity and the P-type impurity, and types and manufacturing method of the respective components can be modified as the case may be.

Figure 4A:
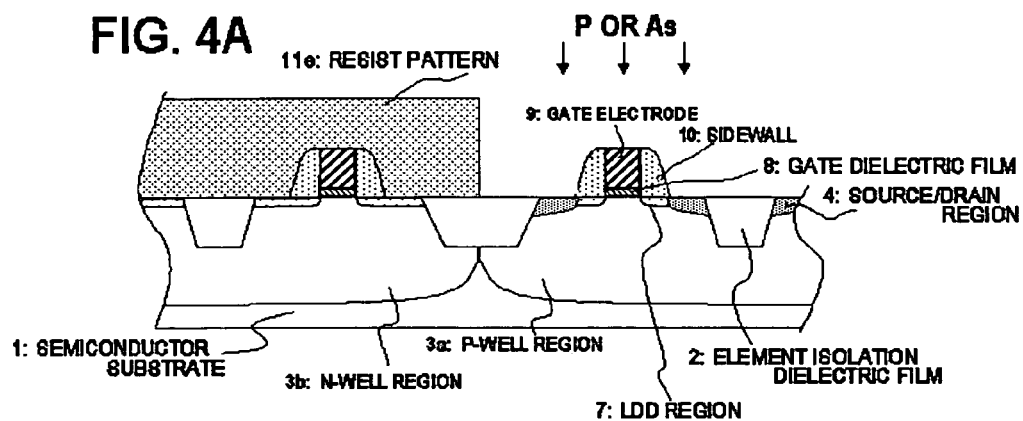
FIG. 4A is a cross-sectional process drawing showing a method of manufacturing a semiconductor device according to an example of the present invention.

Then as shown in FIG. 4A, a resist pattern 11e is formed on the P-MOS region by a known photolithography method, and an N-type impurity such as P or As is implanted utilizing the gate electrode 9 and the sidewall 10 in the N-MOS region as a mask, to form the source/drain region 4 where the N-type impurity has been implanted in a high concentration, in the N-MOS region.

Figure 4B:
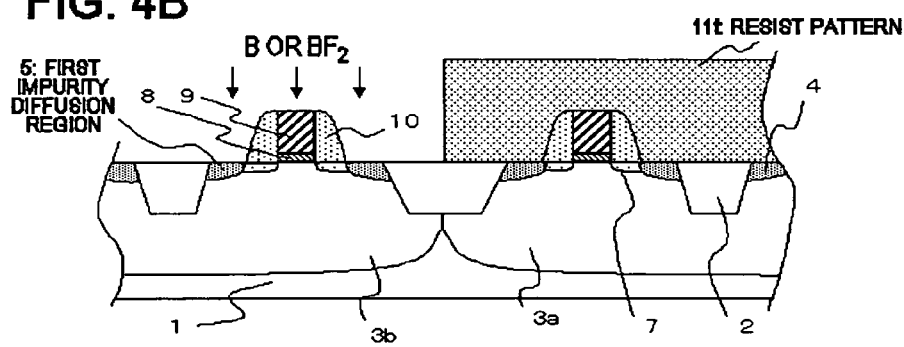
FIG. 4B is a cross-sectional process drawing showing a method of manufacturing a semiconductor device according to an example of the present invention.

Then after removing the resist pattern 11e, a resist pattern 11f is formed on the N-MOS region by a known photolithography method, and B or $BF_2$ is implanted utilizing the gate electrode 9 and the sidewall 10 in the P-MOS region as a mask, to form the first impurity diffusion region 5 where the N-type impurity has been implanted in a high concentration, in the P-MOS region as shown in FIG. 4B. Referring to the implanting conditions in this step, it is preferable to employ an implanting energy of approx. 1 to 3 keV, and an implanting amount of approx. $5 \times 10^{14}$ to $1 \times 10^{16}$ cm$^{-2}$, when utilizing B for example.

Figure 4C:
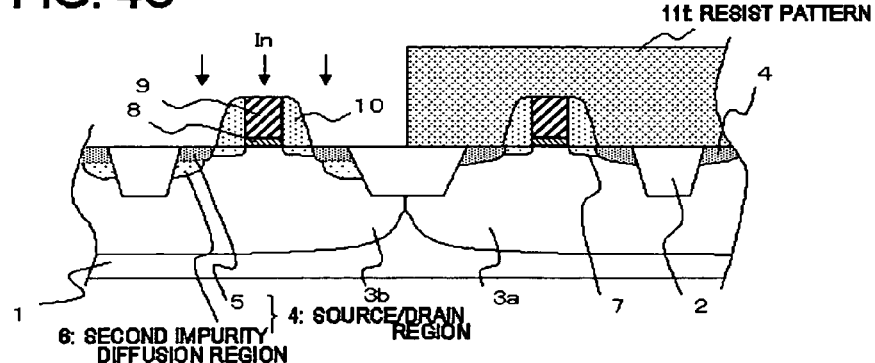
FIG. 4C is a cross-sectional process drawing showing a method of manufacturing a semiconductor device according to an example of the present invention.

Now referring to FIG. 4C, In is implanted utilizing the gate electrode 9 and the sidewall 10 in the P-MOS region as a mask to form the second impurity diffusion region 6 at a bottom portion of the first impurity diffusion region 5, so that the first impurity diffusion region 5 and the second impurity diffusion region 6 constitute the source/drain region 4 having an impurity concentration distribution as shown in FIG. 1B. When executing this In implantation, the implanting conditions have to be determined such that the second impurity diffusion region 6 is formed at a bottom portion of the first impurity diffusion region 5; so as to milden a gradient of the impurity concentration distribution of the first impurity diffusion region 5; further so as to restrain leakage originating from a defect that may caused by In and to thereby prevent reliability of the gate dielectric film 8 from being degraded because of penetration of In implanted onto the gate, as subsequently described. Accordingly, in this example the In implanting conditions are set as approx. 50 to 200 keV of implanting energy, and approx. $1\times10^{12}$ to $5\times10^{13}$ cm$^{-2}$ of implanting amount.

Figure 7:
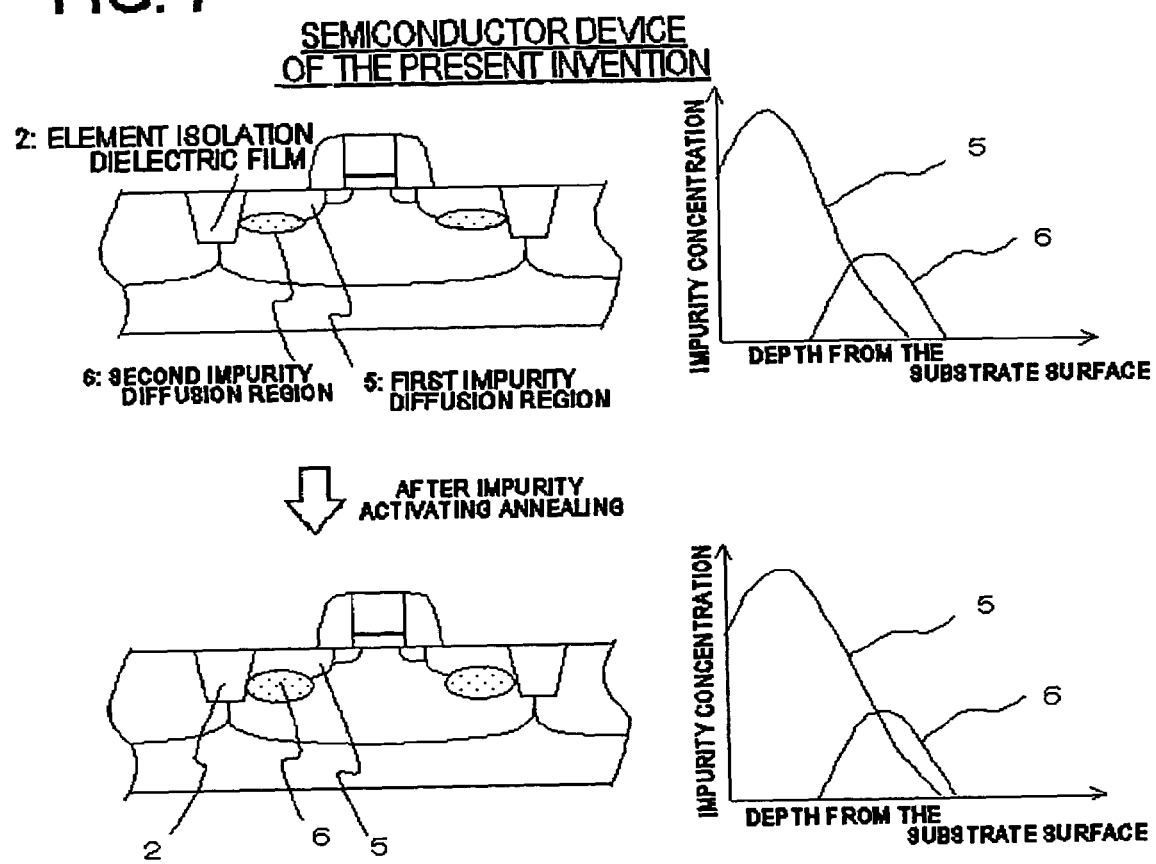
FIG. 7 includes cross-sectional drawings and graphs showing a transition of impurity concentration distribution of a semiconductor device according to an example of the present invention, before and after an impurity activating annealing process.
Figure 8:
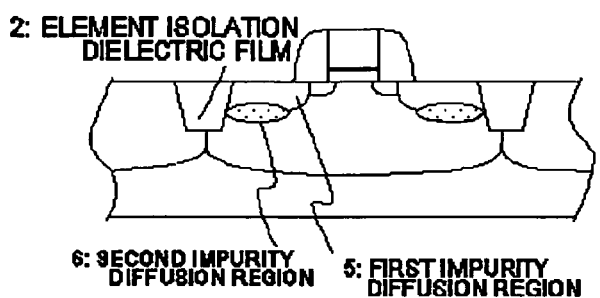
FIG. 8 includes cross-sectional drawings and graphs showing a transition of impurity concentration distribution of a conventional semiconductor device, before and after an impurity activating annealing process.
Figure 8:
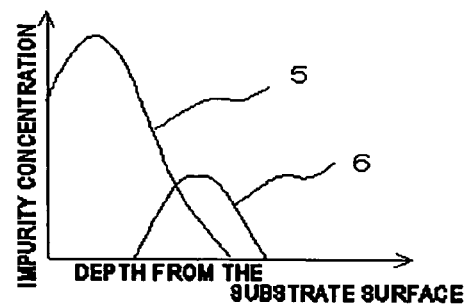
Figure 8:
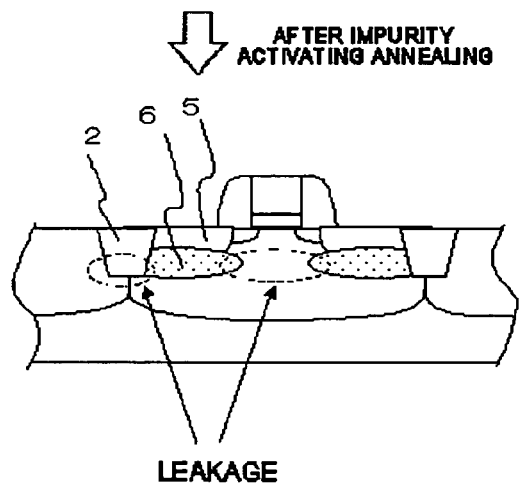
Figure 8:
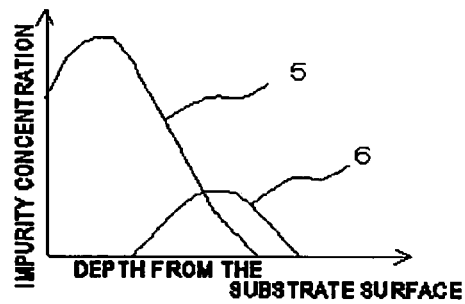

Following the above, annealing is performed for activating the impurity in the N-MOS region and the P-MOS region, in a nitrogen atmosphere or a nitrogen and oxygen atmosphere under a temperature of 800 to 1100 degree centigrade for 0 (spike anneal) to approx. 10 seconds. At this stage, in case where the second impurity diffusion region 6 has also been formed with B or BF$_2$, the second impurity diffusion region 6 expands as far as a bottom portion of the element isolation dielectric film 2 owing to the annealing as shown in FIG. 8, thereby causing leakage in the proximity of a diffusion layer of an adjacent transistor, or causing leakage because of a narrowed separation between the source and the drain, however in case of forming the second impurity diffusion region 6 with In, an expansion of the second impurity diffusion region 6 is restrained as shown in FIG. 7; therefore such leakage as described above can be securely prevented.

Thereafter a contact plug (not shown) is formed on an upper layer on the source/drain region 4, so that a part of the semiconductor device of this example can be completed upon connecting with an interconnect of the upper layer.

Meanwhile, in the foregoing process B or BF$_2$ and In are implanted in the P-MOS region after implanting P or As in the N-MOS region, however the impurity implanting sequence in the N-MOS region and in the P-MOS region may be reversed. Also, either of the impurity implantation for forming the first impurity diffusion region 5 or the impurity implantation for forming the second impurity diffusion region 6 in the P-MOS region can be performed first. Whichever the case may be, the impurity activating annealing is to be performed collectively after executing both of the N-type impurity implantation and the P-type impurity implantation.

Hereafter, conditions of the In implantation, which is the key feature of the present invention, will be studied. As stated earlier, conditions of the In implantation have to be determined such that the second impurity diffusion region 6 is formed at a bottom portion of the first impurity diffusion region 5 and so as to milden a gradient of the impurity concentration distribution of the first impurity diffusion region 5, however taking into account an implanting position and concentration of In is not sufficient.

For instance, leakage originating from a defect may increase because of emergence of a defect by the In implantation, therefore such implanting conditions that can restrain an increase of the leakage have to be determined. Also, since In may pass through the gate electrode 9 to even penetrate through the gate dielectric film 8, thereby degrading reliability of the gate dielectric film 8, an implanting condition that prevents penetration by In through the gate electrode 9 has to be determined.

In view of the above, junction leakage has been measured utilizing an implanting energy and an implanting amount as a parameter in the In implantation, and implanting conditions have been determined based on the measurement result. The details and results of such experiment will be described here below.

Figure 5:
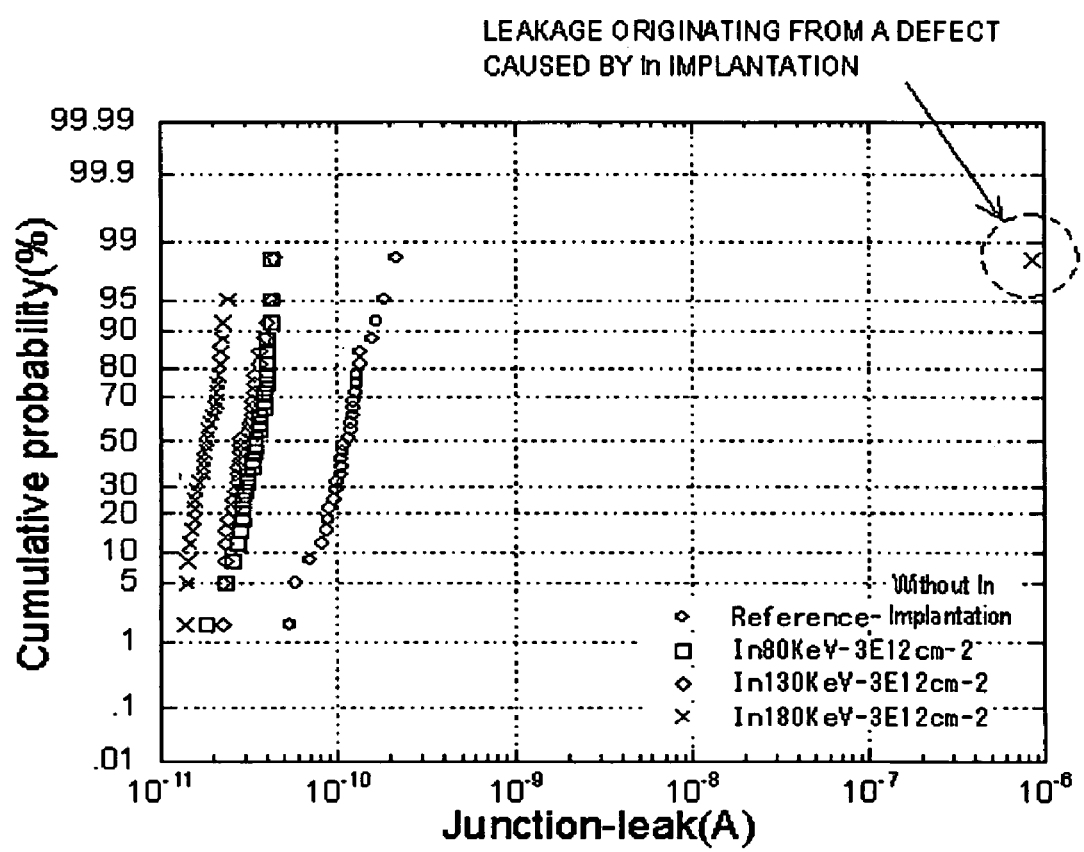
FIG. 5 is a graph showing implanting energy dependence of junction leakage in an In implantation according to an example of the present invention.

Firstly, junction leakage with respect to varying implanting energy was measured with the In implanting amount fixed at $3\times10^{12}$ cm$^{-2}$, to determine a preferable range of the implanting energy. Also, samples on which the In implantation has not been performed (i.e. a sample on which only the first impurity diffusion region 5 has been formed with B or BF$_2$) were made up and a similar measurement was executed for comparison purpose. The results are shown in FIG. 5. The horizontal axis of FIG. 5 represents a value (A) of the junction leakage, while the vertical axis a ratio (a cumulative value) of transistors including junction leakage not exceeding a predetermined value. As is apparent in view of FIG. 5, the junction leakage of the samples on which In has been implanted with an energy of 80 keV (indicated by a square), 130 keV (indicated by a rhombus), and 180 keV (indicated by a cross) is smaller than that of the sample on which In implantation has not been performed (indicated by a circle), from which it is understood that the junction leakage can be reduced by In implantation. Also, though not shown in FIG. 5, it has also been confirmed that a reduction effect of the junction leakage is no longer obtainable when the implanting energy is not greater than 50 keV.

Further, while the reduction effect of the junction leakage becomes greater with an increase of the implanting energy, in case where the In implanting energy becomes excessively high defects caused by the In implantation may increase, resulting in an increase of leakage originating from a defect. For example, junction leakage of approx. $10^{-6}$ A (a position enclosed by a broken line in FIG. 5) is caused in the sample of 180 keV in this experiment. Consequently, it is essential to adjust the In implanting energy in such a range that a sufficient reduction effect of the junction leakage can be obtained, and that, at a time, leakage originating from a defect caused by In implantation can be restrained.

Also, when determining an implanting energy an influence toward the gate dielectric film 8 has also to be taken into account. Currently a height of the gate electrode 9 is becoming lower along with the micronization of semiconductor devices and is expected to be 1500 A (150 nm) or lower in the near future. Under such situation, since the In implantation is performed also on the gate electrode 9, the In ion passes through the gate electrode 9 and may even penetrate through the gate dielectric film 8 when the In implanting energy is excessively high, thus causing a defect in the gate dielectric film 8 and resulting in degradation of reliability of the gate dielectric film 8.

A relation between an In implanting energy and a thickness of the gate electrode 9 that allows penetration of In can be estimated as approx. 300 to 400±300 A (30 to 40±30 nm) against an implanting energy of 80 keV, and approx. 700 to 800±400 A (70 to 80±40 nm) against 200 keV, therefore it is preferable to set an implanting energy of 200 keV or lower in order to prevent an In ion from penetrating the gate electrode 9 of 150 nm in thickness, considering a film thickness error or a channeling effect of the gate electrode 9.

Consequently, it is preferable to set an In implanting energy at approx. 50 to 200 keV, desirably at approx. 80 to 180 keV, according to total consideration of the necessity of reducing junction leakage, restraining leakage originating from a defect caused by In implantation and preventing degradation of reliability of the gate dielectric film 8.

Figure 6A:
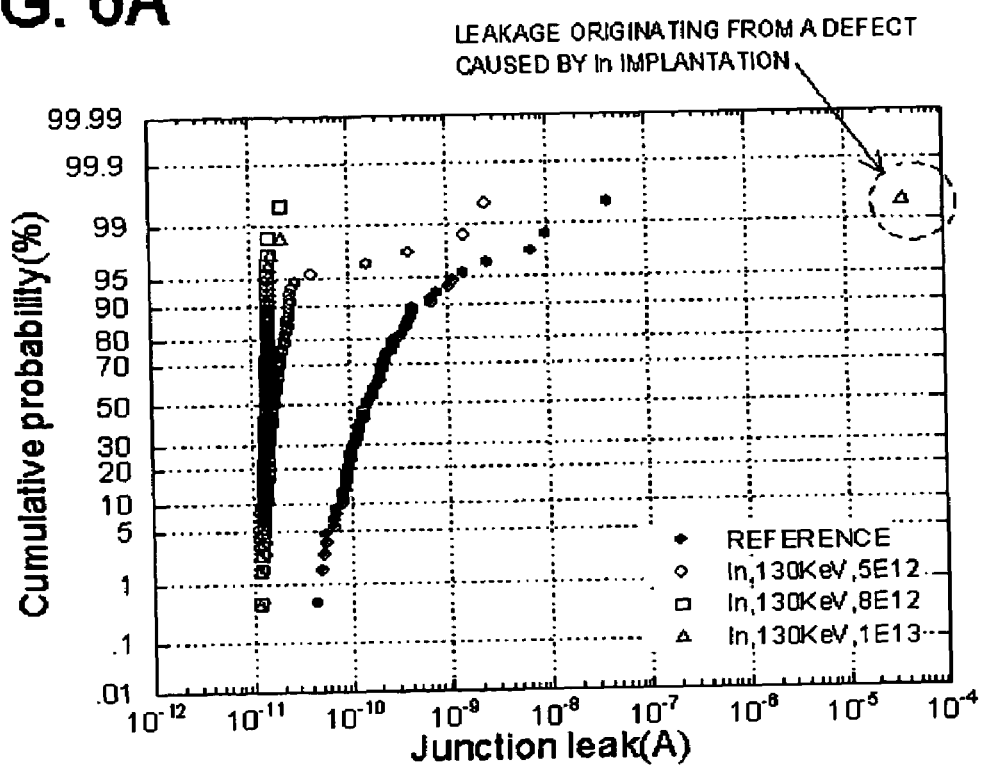
FIG. 6A is a graph showing implanting amount dependence of junction leakage in an In implantation according to an example of the present invention.
Figure 6B:
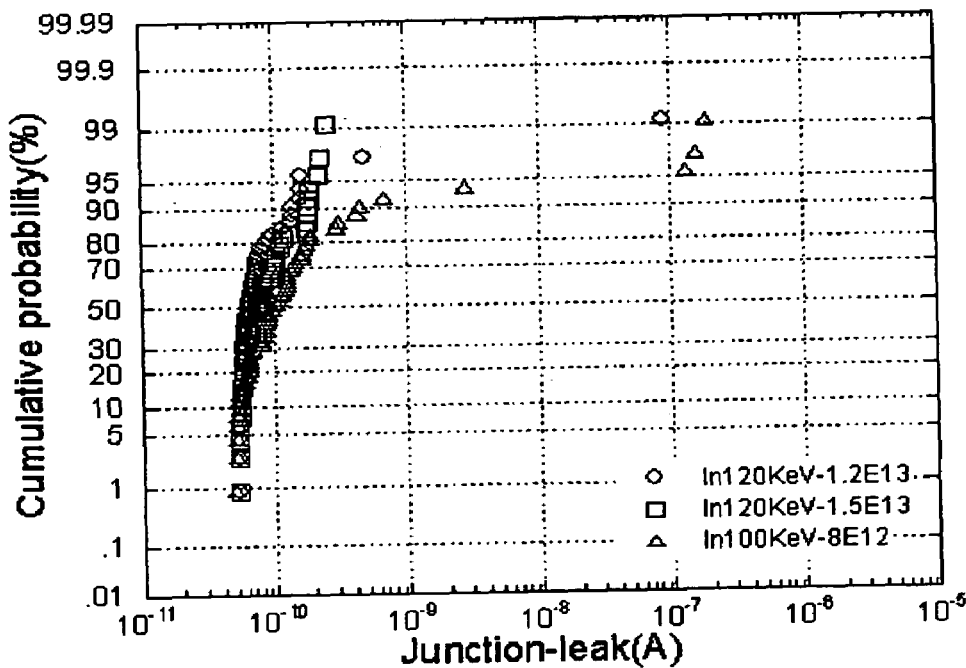
FIG. 6B is a graph showing implanting amount dependence of junction leakage in an In implantation according to an example of the present invention.

Secondly, junction leakage with respect to varying implanting amount was measured with the In implanting energy fixed at 130 and 120 keV, to determine a preferable range of the implanting amount. Also, samples on which the In implantation has not been performed (i.e. a sample on which only the first impurity diffusion region 5 has been formed with B or BF$_2$) were made up and a similar measurement was executed for comparison purpose. The results are shown in FIGS. 6A and 6B. The horizontal axis of FIGS.

6A and 6B represents a value (A) of the junction leakage, while the vertical axis a ratio (a cumulative value) of transistors including junction leakage not exceeding a predetermined value.

As is apparent in view of FIG. 6A, the junction leakage of the samples on which In has been implanted in an amount of $5\times10^{12}$ cm$^{-2}$ (indicated by a circle), $8\times10^{12}$ cm$^{-2}$ (indicated by a square), and $1\times10^{13}$ cm$^{-2}$ (indicated by a triangle) is smaller than that of the sample on which In implantation has not been performed (indicated by a disk) in case where the In implanting energy is fixed at 130 keV, from which it is understood that the junction leakage can be reduced by In implantation as in the foregoing case. Also, though not shown in FIG. 6A, it has also been confirmed that a reduction effect of the junction leakage is no longer obtainable when the implanting amount is not greater than $1\times10^{12}$ cm$^{-2}$.

Further, while the reduction effect of the junction leakage becomes greater with an increase of the implanting amount, in case where the In implanting amount becomes excessive, defects caused by the In implantation may increase, resulting in an increase of leakage originating from the defect. For example, junction leakage of approx. $10^{-4}$ A (a position enclosed by a broken line in FIG. 6A) is caused in the sample of $1\times10^{13}$ cm$^{-2}$ in this experiment. Also, restraining the In implanting energy enables increasing the In implanting amount. For example, in case where the In implanting energy is set at 120 keV, junction leakage originating from a defect is not incurred even with the sample of $1.5\times10^{13}$ cm$^{-2}$, as shown in FIG. 6B. Consequently, it is essential to adjust the In implanting amount in such a range that a sufficient reduction effect of the junction leakage can be obtained, and that, at a time, leakage originating from a defect caused by In implantation can be restrained; specifically in a range of approx. $1\times10^{12}$ to $5\times10^{13}$ cm$^{-2}$, more preferably in a range of approx. $5\times10^{12}$ to $1.5\times10^{13}$ cm$^{-2}$.

Accordingly, as a result of forming the source/drain region 4 of the P-MOS transistor with the first impurity diffusion region 5 formed by implantation of B or BF$_2$ and the second impurity diffusion region 6 formed by In implantation in a predetermined implanting energy and a predetermined implanting amount, a short channel effect caused by diffusion of B can be restrained, and also junction leakage incurred by a silicide layer can be restrained.

Also, forming the second impurity diffusion layer 6 utilizing In offers the advantages that an excessive expansion of In can be prevented when diffused by an impurity activating heat treatment; a desirable isolation characteristic can be maintained; and a defect caused by impurity implantation can be restored; therefore junction leakage originating from a defect can also be reduced.

Further, unlike a case of forming the second impurity diffusion layer 6 with B or BF$_2$, degradation of reliability of the gate dielectric film 8 or variation of transistor characteristic due to diffusion of B in the gate dielectric film 8 can be restrained. Furthermore, performing the In implantation under appropriate conditions permits restraining leakage originating from a defect caused by the In implantation, and also restraining degradation of reliability of the gate dielectric film 8 or variation of transistor characteristic caused by penetration of In through the gate dielectric film 8.

The present invention has been described as above based on the example. However it is to be understood that the foregoing example is only exemplary, and that it is apparent to those skilled in the art that various modifications can be made to constituents or process or a combination thereof, without departing from the scope and spirit of the present invention.

For example, B or BF$_2$ is used as an impurity for forming the first impurity diffusion region 5 and In is used as an impurity for forming the second impurity diffusion region 6 according to this example, however it is to be understood that the present invention is not limited to the above example, and that another impurity can also be employed for forming the second impurity diffusion region 6, provided that the impurity has a smaller diffusion coefficient in the semiconductor substrate than an impurity for forming the first impurity diffusion region 5, and has a greater mass number that permits an accurate implantation into a deep position.

What is claimed is:

1. A semiconductor device provided with a semiconductor substrate; a gate electrode formed on said semiconductor substrate; and an impurity diffusion region formed beside said gate electrode with a PN junction with a region in the semiconductor substrate; wherein:
    the impurity diffusion region comprises a first impurity diffusion region including a first P-type impurity and located in the proximity of a surface of the semiconductor substrate; and
    a second P-type impurity diffusion region located below the first impurity diffusion region and including a second P-type impurity having a smaller diffusion coefficient in the semiconductor substrate than the first P-type impurity, each of said first impurity diffusion region and said second impurity diffusion region forming the PN junction with the region of the semiconductor substrate.

2. The semiconductor device in accordance with the claim 1, wherein a concentration of the second P-type impurity in the second impurity diffusion region is lower than a concentration of the first P-type impurity in the first impurity diffusion region.

3. The semiconductor device in accordance with the claim 1, wherein the first P-type impurity includes B.

4. The semiconductor device in accordance with the claim 1, wherein the second P-type impurity includes In.

5. The semiconductor device in accordance with the claim 1, wherein said impurity diffusion regions are provided on both sides of said gate electrode.

6. A semiconductor device provided with a semiconductor substrate;
    a pair of LDD regions formed apart from each other to define a channel region;
    a gate electrode formed over the channel region,
    a source region formed in contact with one of the LDD regions on an opposite side of the channel region; and
    a drain region formed in contact with another LDD region on an opposite side of the channel region;
    each of said source region and said drain region comprises a first impurity diffusion region including a first P-type impurity and located in the proximity of a surface of the semiconductor substrate;
    a second P-type impurity diffusion region located below the first impurity diffusion region and including a second P-type impurity having a smaller diffusion coefficient in the semiconductor substrate than the first P-type impurity; and
    each of the LDD regions including the first P-type impurity and not including the second P-type impurity.

7. A semiconductor device according to claim 6, wherein a concentration of the second P-type impurity in the second impurity diffusion region is lower than a concentration of the first P-type impurity in the first impurity diffusion region.

8. A semiconductor device according to claim 6, wherein the first P-type impurity includes B.

9. A semiconductor device according to claim 6, wherein the second P-type impurity includes In.

10. A semiconductor device, comprising:
a gate electrode formed on a semiconductor substrate;
a LDD region formed beside said gate electrode, the LDD region including a first P-type impurity;
a sidewall formed on a lateral face of said gate electrode;
a first impurity diffusion region formed beside the sidewall and in deeper position than the LDD region, the first impurity diffusion region including the first P-type impurity;
a second impurity diffusion region that is formed beside the sidewall and in further deeper position than the first impurity diffusion region, said second impurity diffusion region including a second P-type impurity that has a smaller diffusion coefficient than a first P-type impurity, wherein an impurity concentration of the second impurity diffusion region is lower than that of the first impurity diffusion region, and distance between second impurity diffusion regions that are formed on both sides of the gate electrode is larger than that between first impurity diffusion regions that are formed on both sides of the gate electrode.

11. A semiconductor device according to claim 10, wherein the first P-type impurity includes B.

12. A semiconductor device according to claim 10, wherein the second P-type impurity includes In.

13. A semiconductor device according to claim 10, wherein the impurity concentration of said first impurity diffusion region has a steeper gradient in a depth wise direction than that of second impurity diffusion region.

* * * * *